SR

XR 3,334,307

9008
1086
X 89213

Aug. 1, 1967 A. S. BLUM 3,334,307

MULTI-ELECTRODE ACOUSTIC AMPLIFIER WITH UNITARY TRANSDUCING AND TRANSLATING MEDIUM

Filed Nov. 14, 1966

Inventor
Asher S. Blum
By [signature]
Attorney

3334307
OR IN 330/5.5

United States Patent Office 3,334,307

Patented Aug. 1, 1967

3,334,307

MULTI-ELECTRODE ACOUSTIC AMPLIFIER WITH UNITARY TRANSDUCING AND TRANSLATING MEDIUM

Asher S. Blum, St. Louis, Mo., assignor to Zenith Radio Corporation, Chicago, Ill., a corporation of Delaware Filed Nov. 14, 1966, Ser. No. 594,000
18 Claims. (Cl. 330—5.5)

ABSTRACT OF THE DISCLOSURE

Acoustic waves are propagated along a body comprising piezoelectric semiconductive material, and the conversion between electrical and acoustic signals is accomplished with an electrode system on the body itself rather than by the use of a discrete transducer. Preferably, such an electrode system comprises a plurality of electrode pairs spaced successively along the length of the body with individual electrodes of each pair disposed on opposing sides of the body and coupled together at the signal frequency. In addition, the even and odd ones of the pairs individually are similarly coupled.

This invention pertains to signal translating apparatus. More specifically, it relates to an acoustic amplifier in which the signal translating medium itself acts as transducer of the electric signals. While modifications of the amplifier enable operation at frequencies of the order of 40 megacycles and higher, there is particular suitability of application in the 10 megacycle range, and the amplifier is therefore described primarily in that environment.

It is known that when an electric signal is introduced in a piezoelectric material along a piezoelectric axis, an acoustic wave is produced in the material accompanied by an electronic wave of alternating electric potential. A DC field produced across the piezoelectric medium is capable of interacting with the electrons accompanying the acoustic waves and, at proper magnitudes of the DC field, amplification of the acoustic wave results.

In a conventional acoustic amplifier, separate transducers are mechanically coupled to the amplifying piezoelectric medium to convert between electrical signals and the acoustic waves. This mechanical coupling takes the form of a low loss bonding agent between two highly polished surfaces which minimize interface mode conversion. In addition, the DC field required to provide useful amplification at the desired operating frequencies tends to cause overheating of the piezoelectric medium, often leading to a requirement of pulsed operation.

Accordingly, it is the primary object of the present invention to provide a new and improved acoustic amplifier.

It is a more specific object of the present invention to provide an acoustic amplifier which obviates the need for separate, mechanically-bonded transducers.

It is another object of the invention to provide an acoustic amplifier which may be operated continuously at reasonable gain levels.

In the conventional acoustic amplifier in which the wave is amplified in the forward direction, there is relatively little attenuation of the reflected backward wave. This may result in an instability effecting a tendency of the amplifier to break into oscillation, especially at higher gain levels. It is a further object of the present invention to provide an acoustic amplifier which is operationally stable.

While this invention contemplates a unitary transducing and translating medium, it requires, in its most typical form, a translating medium whose thickness is of the order of this one-half wavelength value. As the signal frequency increases, the requisite thickness of the translating medium becomes prohibitively small. Accordingly, it is yet another object of the present invention to provide an acoustic amplifier having a unitary transducing and translating medium which may be of a thickness greater than one-half the wavelength of the signal to be amplified.

Signal translating apparatus constructed in accordance with the present invention includes a body of piezoelectric semiconductive material in which acoustic bulk waves are propagated. For transducing between those waves and electric signals, an electrode system is composed of a plurality of electrode pairs spaced successively along the length of the body. The individual electrodes of each pair are disposed on space opposed portions of the body and are coupled in common at the wave frequency. Further, the even ones of the pairs are coupled in common, as are the odd ones of the pairs, and the electric signals are exhibited between the even and odd pairs.

The features of the present invention which are believed to be novel are set forth with particularity in the appended claims. The organization and manner of operation of the invention, together with further objects and advantages thereof, may best be understood by reference to the following description taken in connection with accompanying drawing, in the several figures with which like reference numerals identify like elements and in which:

Figures 1, 2, 3:
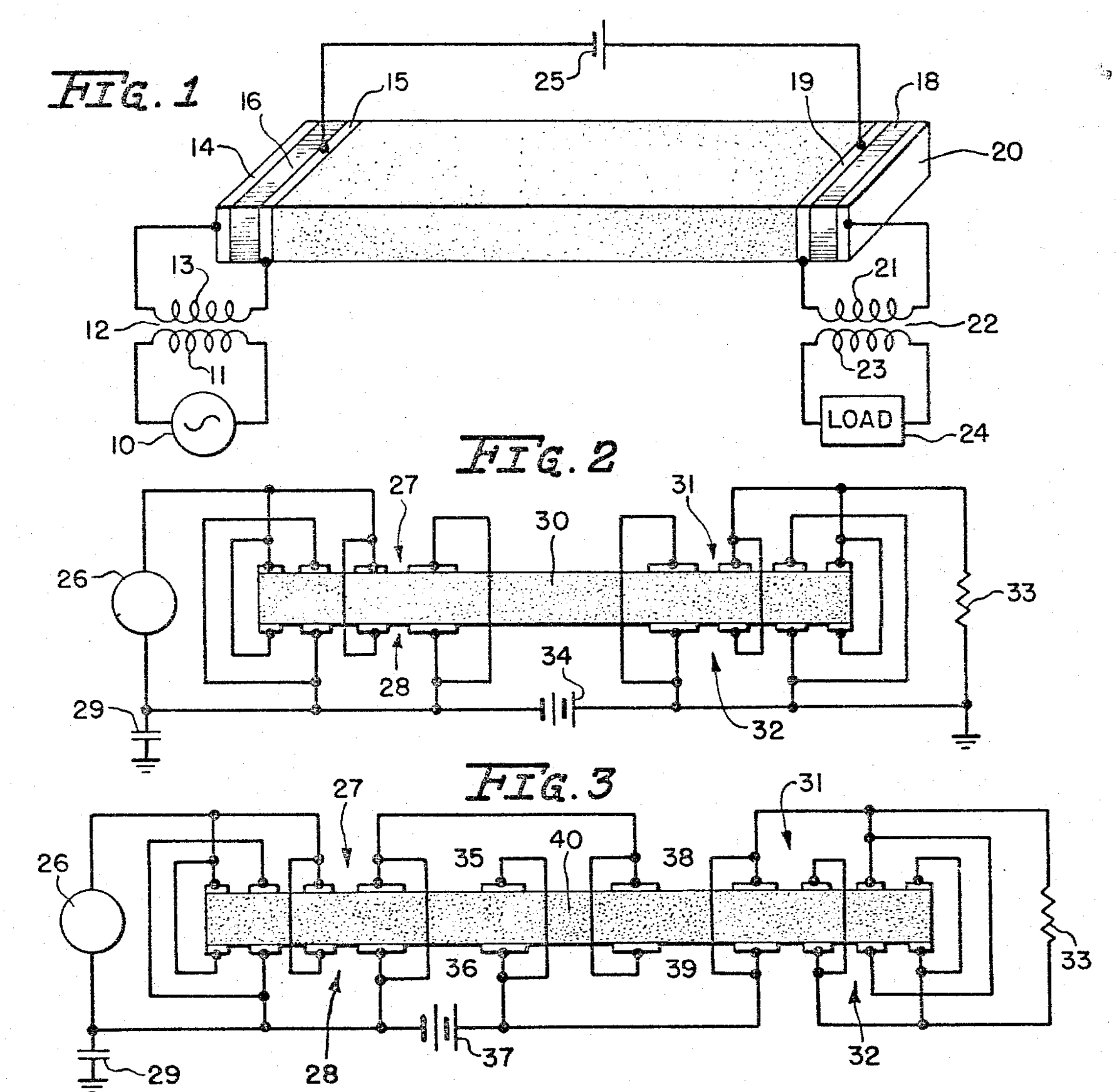
FIGURE 1 is a partly schematic longitudinal perspective view of a conventional acoustic amplifier.
FIGURE 2 is a partly schematic longitudinal side view of an improved acoustic amplifier.
FIGURE 3 is a partly schematic longitudinal side elevational view of an alternative improved unidirectional acoustic amplifier.

In the conventional device of FIGURE 1, an input signal source 10, which may for example constitute the heterodyne converter or so-called first detector of a superheterodyne AM or FM radio receiver, is coupled across the primary winding 11 of an input coupling transformer 12. The secondary winding 13 of transformer 12 is in turn coupled across the opposed surface electrodes 14 and 15 of a piezoelectric input transducer 16. Input transducer 16 is mechanically coupled to one end of an acoustic wave propagating device in the form of an elongated bar-shaped element 17 of piezoelectric semiconductive material such as cadmium sulfide. The length of element 17 is large relative to the wavelength in the semiconductive material of waves propagated therein in response to the signal from source 10.

The output end of element 17 is in turn mechanically coupled to a piezoelectric output transducer 18. The output electrodes 19 and 20 of transducer 18 are coupled to the primary winding 21 of an output transformer 22, the secondary winding 23 of which is coupled to a suitable output load 24 that may, for example, constitute the input impedance of an additional stage of intermediate frequency amplification or of the modulation detector or so-called second detector of a superheterodyne AM or FM broadcast receiver. A steady state bias source, here schematically represented as a battery 25, is coupled between the ends of element 17.

In operation, the input signal from source 10 produces mechanical or acoustic vibration of input transducer 16 which in turn transmits such vibration to piezoelectric semiconductive element 17. The mechanical wave vibrations or waves are propagated through the piezoelectric semiconductive medium 17 and then imparted to output transducer 18 where they are converted to an electrical output signal for application to load 24. By virtue of the bias current from source 25, the output signal developed across load 24 is an amplified version of the input signal applied from source 10. The basic principles involved in the amplification mechanism are explained fully in the copending application of Robert Adler, Ser. No. 499,936, filed Oct. 21, 1965, and assigned to the same assignee as the present application. Very briefly, the mechanical waves create electric charge bunches in element 17 that develop electric fields which are influenced by charge carriers, caused to drift by source 25, in a manner reacting upon element 17 piezoelectrically to modify the amplitude of the acoustic waves. The mechanism is analogous to that of the conventional electron-beam traveling-wave tube.

FIGURE 2 represents an improved acoustic amplifier featuring transducers constructed integrally with the acoustic wave propagating medium. Signal source 26 is coupled to electrode arrays 27 and 28 which are affixed to opposite sides of a body of piezoelectric semiconductive material in the form of a thin sheet 30. A DC blocking capacitor 29 also is connected between one side of source 26 and ground. Arrays 27 and 28 are composed of thin strips of a highly conductive material such as indium or aluminum disposed parallel to each other and perpendicular to the axis of acoustic wave propagation. The center lines of the strips are separated by one-half wavelength of the acoustic wave in sheet 30 at the frequency of the signal to be amplified.

Each of the strips of array 27 has a spatially corresponding strip in array 28. Source 26 is coupled to arrays 27 and 28 by connecting alternating strips of array 27 to one side of source 26 and the other strips of array 27 to the other side of source 26, forming an interleaved equipotential "comb" pattern. The strips of array 28 are similarly connected at the same potential as their respective spatially corresponding strips in array 27. At the output end of sheet 30, electrode arrays 31 and 32 are connected across a load 33 in a manner similar to the connections to arrays 27 and 28. A direct current source 34 is connected between the innermost strips of the input and output arrays. The outermost strips in electrode arrays 27 and 28 and in arrays 31 and 32 are one-half the width of the next succeeding strips in each array, and sheet 30 terminates at the outer edges of the outermost strips. The innermost strip in each of the four electrode arrays preferably is wider than the others, but the exact width is not critical.

In overall operation, the device of FIGURE 2 is quite similar to the conventional acoustic amplifier depicted in FIGURE 1. Source 34 introduces a current in sheet 30 between the innermost strips of the electrode arrays. Typically, a potential of several hundred or even several thousand volts is applied between the innermost electrodes of the input and output arrays. The particular value depends on the distance between the inner electrodes, the electron mobility in the material and the type of wave mode excited, e.g., shear waves or longitudinal waves.

When the signal potential supplied by source 26 is applied to the strips, a series of oppositely directed predominantly longitudinal electric fields are developed between successive pairs of the opposed pairs of electrode strips. Since sheet 30 is thin, these fields tend to be, as a first approximation, uniformly directed along the axis of acoustic wave propagation. The behaviour is much the same as stacking several ordinary piezoelectric transducers of the variety depicted in the apparatus of FIGURE 1 and exciting each succeeding transducer with an electric signal of opposite polarity to that on the preceding transducer. From this analogy, it is worthy of note that if source 26 were broadband, the apparatus could act as a filter wherein selectivity depended upon the number and geometry of the strips. Apparatus utilizing this selectivity principle for surface waves rather than bulk waves is described in the application of Adrian De Vries, Ser. No. 582,387, filed Sept. 27, 1966, and assigned to the same assignee as the present invention.

The fields developed by arrays 27, 28 cause alternate expansions and contractions which result in the production of acoustic waves in sheet 30. These acoustic waves travel through the sheet and piezoelectrically generate corresponding alternating electric fields which in turn create electric charge bunches. Also in the sheet are charge carriers drifting longitudinally under the influence of bias source 34. When source 34 causes the charge carriers in sheet 30 to drift at the phase velocity of the acoustic waves, they have little effect upon the charge bunches and the latter tend to neutralize the piezoelectric fields. However, when source 34 is of a different magnitude, it shifts the position of the charge bunches, preventing total neutralization as a result of which the amplitude of the acoustic wave components are changed. When the charge carriers drift along at a velocity above that of the acoustic wave in sheet 30, amplification of that wave occurs.

In a typical embodiment intended for use near 10 megacycles and operated in the shear mode of wave action, a sheet of cadmium sulfide 0.1 inch wide and 0.0035 inch thick is used. In order to make the piezoelectric semiconductor suitably conductive, any of the known techniques, such as doping, stoichiometric unbalance, or optical illumination of the amplifying section between the innermost electrodes, may be used. The outermost strips are 0.001 inch wide while succeeding strips are 0.002 inch wide and the spacing between successive strips is 0.002 inch. The innermost strips are chosen to be 0.006 inch in width, but this may be increased or decreased as deemed desirable by considerations of DC contact conductivity and AC grounding. The innermost strips of the two arrays define an interaction region 400 mils long. As previously indicated, the centers of the strips in each array are placed one-half acoustic wavelength apart to obtain maximum response at a given frequency; this is 0.004 inch in the example. The widened innermost strips are at AC ground potential to minimize signal feedthrough from input to output. In addition, the use of a strip width several times the thickness of the piezoelectric sheet minimizes feedthrough due to capacitive coupling between the ungrounded strips at opposite ends of the bar. With the material of sheet 30 exhibiting a mobility of about 300 cm.$^2$/volt-seconds, source 34 applies a potential of about 1000 volts between the arrays to produce a voltage gradient of approximately 1100 volts/centimeter. Finally, for the development of shear mode bulk waves, the crystallographic or Z-axis of the piezoelectric material is oriented parallel to the electrode strips. Operation may also be obtained in the longitudinal mode, in which case the Z-axis is oriented longitudinally between the electrode arrays, the strip spacing is somewhat larger and a larger voltage gradient, perhaps 2000 volts, is developed by source 34.

FIGURE 3 depicts an arrangement which requires less DC operating voltage and, with proper electrode positioning, is suitable for unidirectional signal translation. Source 26 is connected as before across electrode arrays 27 and 28 located on opposite sides of piezoelectric semiconductor sheet 40. Load 33 is likewise coupled across electrode arrays 31 and 32 in the manner of the apparatus in FIGURE 2. Spaced inwardly from the innermost electrodes of arrays 27, 28 are electrodes 35 and 36 disposed respectively on opposite sides of sheet 40 and electrically connected together. A DC source 37 is connected between electrode pair 35, 36 and the innermost electrodes of arrays 27 and 28. Further along sheet 40 toward the output end is an electrode pair 38, 39 positioned similarly to pair 35, 36 on sheet 40 and connected together and to the innermost electrodes of arrays 27 and 28. Each of electrodes 35–39 is of a size similar to that of the innermost electrodes of arrays 27, 28 and 31, 32. The innermost electrodes of output arrays 31 and 32 are placed at the same potential as electrode pair 35, 36 by connection directly thereto.

Figure 4:
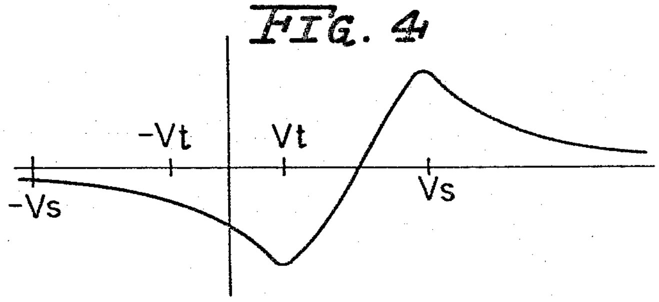
FIGURE 4 is a curve depicting amplification versus the DC voltage applied to a particular signal translating medium used in the device of FIGURE 3.

To facilitate an understanding of the particular advantages of this embodiment, it is useful to consider the curve of FIGURE 4 where amplification of an acoustic wave is plotted vertically as a function of the applied DC voltage, plotted horizontally, across a sheet of piezoelectric semiconductor material of given length. At a voltage $V_s$, the acoustic wave being translated in the material receives maximum amplification. However, a wave which travels under the influence of a DC bias of $-V_s$ is slightly attenuated.

In operation, the device of FIGURE 3 acts as a series of acoustic amplifiers. More specifically, the signal induced across electrode arrays 27 and 28 is thereby launched into sheet 40 as an acoustic wave. Between the innermost electrodes of arrays 27 and 28 and electrode pair 35, 36, the acoustic wave is amplified as described for the operation of the embodiment depicted in FIGURE 2. The amount of gain in this section is a function of the correlation of the length of the section with the DC voltage applied by source 37. Maximum gain occurs with operation at the value $V_s$ in FIGURE 4. However, between electrode pairs 35, 36 and 38, 39, the DC bias encountered by the acoustic wave in sheet 40 is exactly the negative ($-V_s$) of the bias encountered in the previous section. The wave, therefore, is only slightly attenuated in its travel in this section. Finally, in the section between electrode pair 38, 39 and the innermost electrodes of arrays 31 and 32, the acoustic wave encounters a bias identical to that encountered in the first amplifying section bounded by electrodes 35, 36 and the innermost elements of arrays 27, 28. As a result, the wave is once again amplified at a gain level determined as in the first section. The wave then produces a signal across the arrays 31 and 32 which is fed to load 33 as described in connection with FIGURE 2. With the DC electrodes arranged and excited in this manner, the required DC voltage to produce a given amount of amplification is reduced for a device otherwise like that in FIGURE 2, because the two gain sections are connected in parallel across the same DC source.

Other circuitry, for example, additional DC sources may be used to create the oppositely directed drift regions in sheet 40; that in FIGURE 3 is advantageous in that it requires but a single DC source and that source is of less voltage than if one source was used to achieve the same amount of amplification with only two similarized translating sections. Further, additional numbers of sections may be utilized. For a gain level the same as that of the apparatus depicted in FIGURE 2, sheet 40 must be longer than sheet 30, because the length of the nonamplifying central section, bounded by electrode pairs 35, 36 and 38, 39, must be added to the length of the sheet. Also, since there is a little attenuation in the nonamplifying section, the DC potential or the length of the amplifying sections must be increased slightly to achieve the same gain. It will be observed that the charge carriers drift in one direction in the forward-wave amplifying sections and in the opposite direction in the central forward-wave nonamplifying section.

Referring again to FIGURE 4, at a voltage $V_t$ maximum attenuation of an acoustic wave results. However, at $-V_t$, there is substantially less attenuation. With an increase in the length of the central portion of sheet 40, maximum attenuation occurs at a higher voltage. By selecting the length of the negatively biased central region to achieve operation in that region in the vicinity of the value $V_t$, unidirectionality of net wave amplification in sheet 40 is achieved. This alteration of attenuation characteristics may also be attained by varying the resistivity of the sections or by using different materials for the different sections and bonding them together.

To the end, then, of achieving such unidirectionality, the apparatus depicted in FIGURE 3 is so constructed that the nonamplifying section, that is, the central section between electrode pairs 35, 36 and 38, 39, is elongated as compared with the amplifying sections. The voltage produced by DC source 37 results in only slightly more attenuation of the forward-directed wave, with respect to which it is a negative bias, than when the section is shorter, but it results in significantly higher attenuation of the back-directed wave reflected from the output end. With the amplifying sections having a length as described above for producing a given gain, there is no change in the total forward gain of the apparatus except for the small reduction caused by the increased attenuation of the forward wave in the nonamplifying section. The backward wave, reflected from the output end of the sheet 40, encounters a voltage gradient in the amplifying sections equal to the negative of the voltage gradients encountered by the forward directed wave and hence, as explained previously, is only slightly attenuated in those sections. However, in the nonamplifying central region, where the forward directed wave is but slightly attenuated, the increased length of this central region is such that the voltage produced by the source 37 corresponds to the value $V_t$ and there is sharp attenuation of the backward directed wave. The resulting amplifier is, therefore, essentially unidirectional.

This same result may be achieved by utilizing a similar electrode configuration but employing separate voltage sources. That is, the DC voltage values across the different sections are adjusted, in consideration of the characteristics shown in FIGURE 4, instead of the lengths. Specifically, the negative bias on the nonamplifying section is at a voltage of the value $V_t$, while on the amplifying sections the biases are of the value $V_s$. In either case, the basic principle is to make use of the piezoelectric semiconductive properties of the signal translating medium itself to transduce the bulk-wave signal and then to utilize the asymmetric properties of the amplification characteristic, by proper biasing of segments of the signal translating medium, to provide the requisite unidirectional operation. Applying these same principles, the effect may be enhanced by increasing the number of such successive forward and reverse biased sections.

Although the spacing and width of the strips may be carefully tailored to result in a wide range of desirable frequency response characteristics, at higher frequencies the spacing of the strips becomes smaller as does the associated thickness of the piezoelectric semiconductive sheet. At such small thicknesses, construction of the bar may become impractical. Yet, thicker structures relying on the same kind of electrode system do not support predominantly longitudinal fields, and unwanted transverse fields appear which produce conversion of the signal energy into undesired acoustic modes of vibration. These restrictions are overcome by causing the electrodes effectively to penetrate into the sheet by using the arrangement shown in FIGURE 5.

Figure 5:
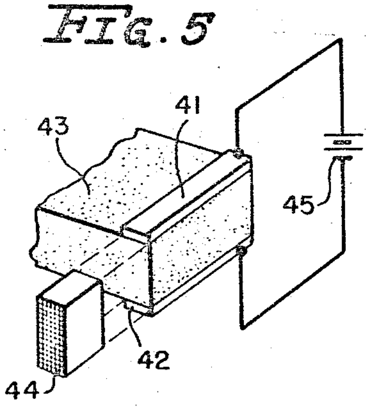
FIGURE 5 is a partly schematic fragmentary perspective view of a modification applicable to the amplifiers of FIGURES 2 and 3.

In FIGURE 5, electrode strips 41 and 42, corresponding to any of the electrode pairs utilized in the embodiments of FIGURES 2 and 3, are placed respectively on the top and bottom of a piezoelectric semiconductive sheet 43. The material of which the electrodes are made is an electron donor such as indium and the strips are vacuum deposited on sheet 43. A light source 44 is then used to project a band of light on the side surface of sheet 43 between electrodes 41 and 42. At the same time, direct current source 45 is connected across electrodes. The illumination effects substantially increased conductivity in sheet 43 between the electrodes as a result of which a heavy current flows through the illuminated region. The current flow produces a significantly increased temperature in the illuminated region and this in turn causes the donor material to diffuse inwardly into the sheet in a well-defined narrow volume between the electrodes. After light source 44 is then extinguished and current source 45 removed, the diffusion region retains a substantially higher conductivity, the effect being that of causing the electrodes to penetrate into sheet 43.

In operation of the devices of either FIGURE 2 or 3 with the electrodes formed by the FIGURE 5 technique, the AC signal field produced by source 26 is approximately longitudinal and a suitable acoustic wave is launched in the sheet even though the sheet is substantially thicker than could be the case without diffusion of the electrode material into the sheet. Design for higher frequencies, therefore, is not necessarily limited by the thinness and mechanical strength of the piezoelectric sheet.

It is evident that the present invention affords new and improved acoustic amplifiers which have substantial advantages over predecessor devices. Having a unitary transducing medium, the necessity of bonding a separate transducer to the translating medium and the related difficulties with interface mode conversion are eliminated. By enabling the translating medium to be very thin in devices of practical size, continuous operation is attainable. Moreover, the arrangements disclosed also permit unconditionally stable operation over broad frequency ranges.

While particular embodiments of the present invention have been shown and described, it will be obvious to those skilled in the art that changes and modifications may be made without departing from the invention in its broader aspects. Accordingly, the aim in the appending claims is to cover all such changes and modifications as fall within the true spirit and scope of the invention.

I claim:

1. In acoustic signal translating apparatus in which acoustic bulk waves are propagated along the length of a body of piezoelectric semiconductive material, a system for transducing between said waves and electrical signals comprising:

an electrode system composed of a plurality of electrode pairs spaced successively along the length of said body with the individual electrodes of each pair disposed on space opposed portions of said body and coupled in common at the frequency of said waves, the even ones of said pairs being coupled in common at said frequency and the odd ones of said pairs being coupled in common at said frequency with said electrical signals being exhibited between said even and odd pairs.

2. Apparatus as defined in claim 1 which includes a second electrode system spaced along the length of said body from the first and composed of a plurality of electrode pairs spaced successively along the length of said body with the individual electrodes of each pair of said second system disposed on space opposed portions of said body and coupled in common at the frequency of said waves, the even ones of said pairs of said second system being coupled in common at said frequency and the odd ones of said pairs of said second system being coupled in common at said frequency with said electrical signals being exhibited between said even and odd pairs of said second system.

3. Apparatus as defined in claim 2 which further includes a source of said signals coupled across said even and odd pairs of the first of said electrode systems and a load coupled across the even and odd pairs of the second of said electrode systems.

4. Apparatus as defined in claim 2 which further includes a direct current source coupled between portions of said body spaced along its length.

5. Apparatus as defined in claim 2 which includes a further pair of electrodes spaced between said first and second electrode systems with its individual electrodes disposed on space opposed portions of said sheet;

and in which charge carriers are caused to drift in said body in one direction on one side of said further pair and in the opposed direction on the other side thereof.

6. Apparatus as defined in claim 5 which includes an additional pair of space opposed electrodes on said body and spaced between said first electrode system and said further pair;

and in which said carriers drifting in said one direction are between said further and additional electrode pairs and carriers are caused to drift in said opposed direction on the side of said additional pair opposite from said further electrode.

7. Apparatus as defined in claim 6 in which said direct current source is direct current coupled between said additional pair and the one of the electrode pairs of said first electrode system nearest thereto with the latter pair direct current coupled to said further pair, and said additional pair is direct current coupled to the one of the electrode pairs of said second electrode system nearest to said further pair.

8. Apparatus as defined in claim 4 in which said direct current source is coupled between electrode pairs of said first and second electrode systems.

9. Apparatus as defined in claim 8 in which said direct current source is coupled between the respective ones of said pairs closest to each other.

10. Apparatus as defined in claim 1 in which the effective distance between said individual electrodes is sufficiently large compared to the thickness of said body between the individual electrodes to enable the creation in said body of signal fields between said even and odd pairs having predominant components lengthwise of said body.

11. Apparatus as defined in claim 1 in which the electrodes of the outer end one of said pairs have a width, lengthwise of said body, approximately one-half that of the electrodes of the next succeeding one of said pairs.

12. Apparatus as defined in claim 1 in which the electrodes of the inner end one of said pairs have a width, lengthwise of said body, greater than that of the electrodes of the next succeeding one of said pairs.

13. Apparatus as defined in claim 1 in which said pairs are spaced apart on center by a distance of one-half the length of said waves.

14. Apparatus as defined in claim 1 which includes a second transducing system spaced along the length of said body from the first and means for creating in a region of said body between said transducing systems charge carriers drifting in a given direction lengthwise of said body at a rate enabling interaction with acoustic waves propagating in said body in said given direction.

15. Apparatus as defined in claim 14 which further includes means for creating, in a second region of said body spaced from the first region and between said transducing systems, charge carriers drifting in a direction opposite said given direction and at a rate enabling interaction with acoustic waves propagating in said body in said opposite direction.

16. Apparatus as defined in claim 15 in which said carriers drifting in one direction have a rate developing cumulative interaction yielding an increase in energy level to the waves propagating in that one direction and the carriers drifting in the other direction have a rate developing attenuative interaction absorbing energy from the waves propagating in that other direction.

17. Apparatus as defined in claim 1 in which said electrodes are composed of a donor material with respect to the material of said body and in which a portion of said donor material is diffused into said body only in the localized region between the individual electrodes in each of said pairs.

18. Acoustic signal translating apparatus comprising:

a body comprising piezoelectric semiconductive material;

at least one pair of longitudinally spaced surface electrodes on said body, with the individual electrodes of each pair including portions disposed on opposite surfaces of said body and coupled in common at a predetermined frequency;

means for impressing an input signal of said predetermined frequency between said pair of electrodes for generating acoustic waves in said body for propagation along its length;

and means including at least one additional pair of surface electrodes on said body, longitudinally spaced from said input electrodes, for deriving an output signal in response to said acoustic waves in said body.

No references cited.

ROY LAKE, *Primary Examiner.*

D. R. HOSTETTER, *Assistant Examiner.*